(12) United States Patent
Tran

(10) Patent No.: US 6,413,390 B1
(45) Date of Patent: Jul. 2, 2002

(54) PLATING SYSTEM WITH REMOTE SECONDARY ANODE FOR SEMICONDUCTOR MANUFACTURING

(75) Inventor: Minh Quoc Tran, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/678,503

(22) Filed: Oct. 2, 2000

(51) Int. Cl.[7] .......................... C25B 15/00; C25B 9/00
(52) U.S. Cl. ...................................... 204/237; 204/269
(58) Field of Search ........................ 204/237, 224 R, 204/269

(56) References Cited

U.S. PATENT DOCUMENTS 6,251,238 B1 * 6/2001 Kaufinan et al. ............ 204/242
6,270,647 B1 * 8/2001 Graham et al. .......... 204/224 R

* cited by examiner

Primary Examiner—Donald R. Valentine
(74) Attorney, Agent, or Firm—Mikio Ishimaru

(57) ABSTRACT

The present invention provides an electroplating system for semiconductor wafers including a plating chamber connected by a circulating system to a plating solution reservoir. The semiconductor wafer is used as the cathode with an inert primary anode in the plating chamber. A consumable remote secondary anode in the plating solution reservoir provides the metal ions for plating.

12 Claims, 2 Drawing Sheets

US 6,413,390 B1

PLATING SYSTEM WITH REMOTE SECONDARY ANODE FOR SEMICONDUCTOR MANUFACTURING

CROSS-REFERENCE TO RELATED APPLICATION(S)

The present application contains subject matter related to concurrently filed U.S. Pat. application Ser. No. 09/678,182 by Minh Quoc Tran and Christy Mei-Chu Woo entitled "PLATING SYSTEM WITH SECONDARY ANODE RING FOR SEMICONDUCTOR MANUFACTURING".

The present application also contains subject matter related to concurrently filed U.S. Pat. application Ser. No. 09/678,504 by Minh Quoc Tran and Christy Mei-Chu Woo entitled "PLATING SYSTEM WITH SHIELDED SECONDARY ANODE FOR SEMICONDUCTOR MANUFACTURING".

TECHNICAL FIELD

The present invention relates generally to semiconductor manufacturing technology and more specifically to electroplating systems using consumable anodes.

BACKGROUND ART

In the past in the manufacture of semiconductors, there have been numerous processes which required plating at various stages to deposit various materials on semiconductor wafers. All of these systems generally required human operator monitoring or the addition of plating materials at timed intervals. Since the addition of plating material was deemed to be one which required a certain degree of expertise and experience, it was not thought to be possible to automate this type of operation without complex, and expensive, computer equipment.

As the industry has sought to make smaller and smaller semiconductor devices with finer and finer device connections, it has been found that conventional metallization techniques for making the device connections is are inadequate for future generations of products. This has resulted in the shift from materials such as aluminum (Al) to copper (Cu).

Copper is not suited for deposition using the metallization techniques used for aluminum and is better adapted for deposition by electro- or electro-less plating processes out of a solution. With the adoption of the copper interconnect, the device connection technology, there has been a great deal of effort placed into automating copper plating technology for semiconductors. This has meant the introduction of expensive equipment. This in turn has meant that much effort has been expended in trying to reduce costs.

One of the processes for depositing copper uses a consumable primary anode in the plating chamber. As the consumable primary anode is consumed, it changes the geometry and the electromotive force in the plating chamber leading to non-uniform deposition of the copper. Non-uniform deposition of the copper leads to difficulties in following planarization steps and in defective integrated circuits around the perimeter of the semiconductor wafer.

A solution for solving this problem simply and inexpensively has been long sought by and eluded those skilled in the art.

DISCLOSURE OF THE INVENTION

The present invention provides an electroplating system for semiconductor wafers including a plating chamber having a consumable remote secondary anode connected by a circulating system to a plating solution reservoir. The semiconductor wafer is used as the cathode with an inert primary anode in the plating chamber and a remote consumable secondary anode in the plating solution reservoir for providing the metal ions for plating. The consumption of the consumable shielded secondary anode does not change the geometry or the electromotive force in the plating chamber and maintains a uniform thickness conductor core deposition which is easily planarized.

The present invention further provides a copper electroplating system for semiconductor wafers including a plating chamber having a consumable copper remote secondary anode connected by a recirculating system to a copper plating solution reservoir. The semiconductor wafer is used as the cathode with an inert platinum anode in the plating chamber and a remote consumable copper secondary anode in the plating solution reservoir for providing the metal ions for plating. The consumption of the consumable copper shielded secondary anode does not change the geometry or the electromotive force in the plating chamber and maintains a uniform thickness conductor core deposition which is easily planarized. The above and additional advantages of the present invention will become apparent to those skilled in the art from a reading of the following detailed description when taken in conjunction with the accompanying drawings.

BEST MODE FOR CARRYING OUT THE INVENTION

Figure 1:
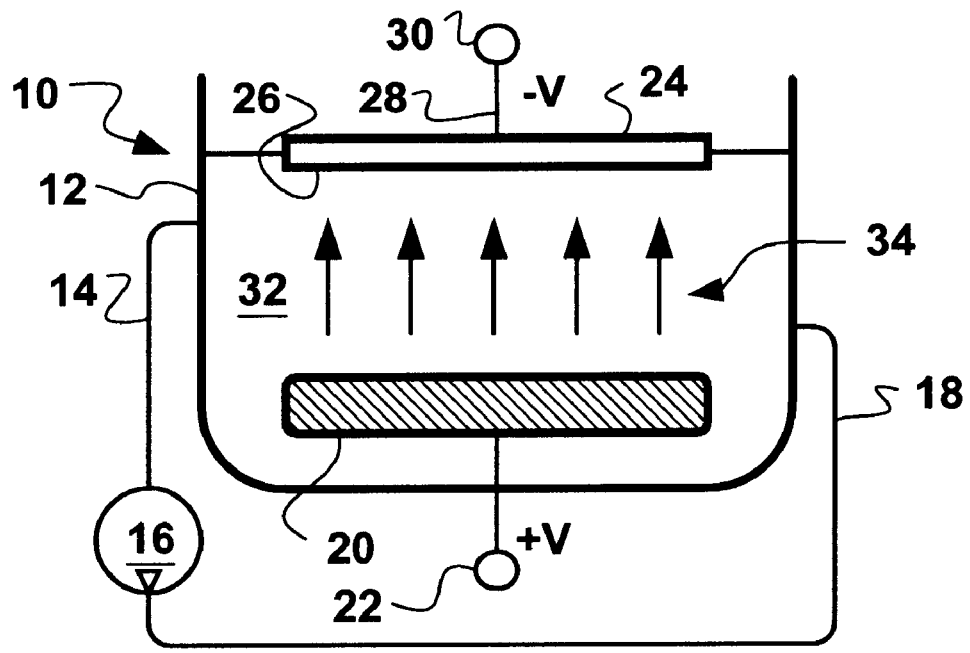
FIG. 1 (PRIOR ART) shows a plating chamber containing a consumable anode.

Referring now to FIG. 1 (PRIOR ART), therein is shown an electroplating system 10 having a plating chamber 12. The plating chamber 12 has an outlet 14 connected to a recirculating pump 16 which is further connected to an inlet 18 to the plating chamber 12.

Within the plating chamber 12 is a consumable primary anode 20 connected to a positive voltage source 22.

Above the consumable primary anode 20 is a semiconductor wafer 24 having a conductive seed layer 26 thereon. The seed layer 26 is connected by a connector 28 to a negative voltage source 30 and acts as the cathode for the plating process.

The semiconductor wafer 24 is positioned so as to place the seed layer 26 in contact with a plating solution 32.

For the electroplating of copper the consumable primary anode 20 is made of copper and the plating solution 32 contains free copper ions. When the voltages are applied, copper ions are migrated from the consumable primary anode 20 to the seed layer 26 along the electromotive field indicated by straight arrows 34 through the plating solution 32. The plating solution 32 is recirculated by the recirculating pump 16 to maintain as constant a copper ion concentration as possible while the cathodic reaction at the seed layer 26 causes the deposition of metallic copper on to the seed layer 26.

Figure 2:
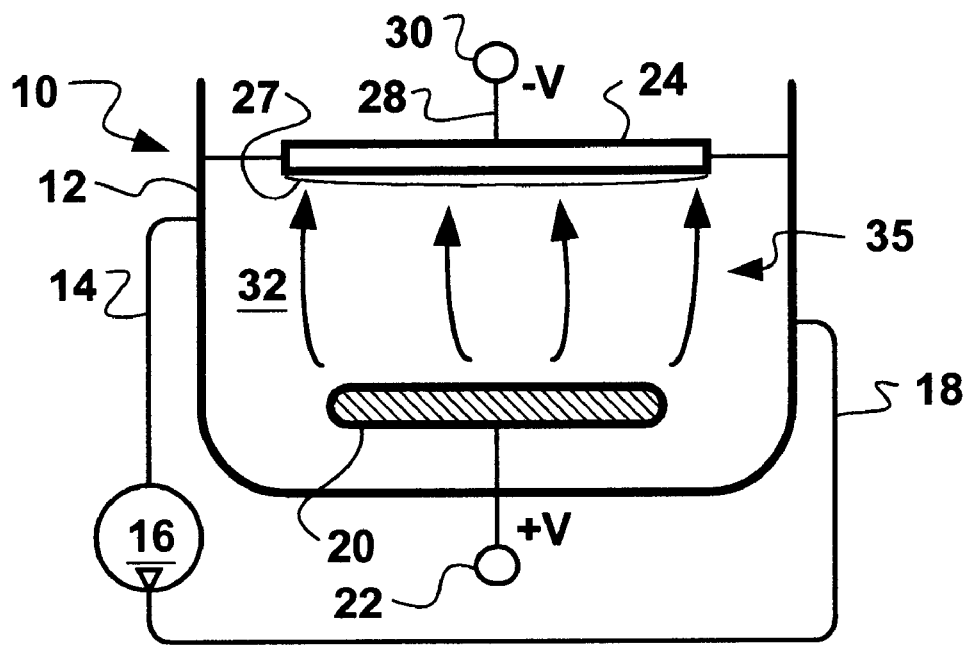
FIG. 2 (PRIOR ART) shows a plating chamber with a portion of the consumable anode consumed.

Referring now to FIG. 2 (PRIOR ART), therein is shown the electroplating system 10 during the electroplating process. The consumable primary anode 20 is shown partially consumed and significantly reduced in size which changes the geometry and the electromotive force in the plating chamber 12. The shape of the electromotive field, as indicated by curved arrows 35, influences the deposition of the metal ions on the seed layer 26 of the semiconductor wafer 24.

Due to the change in the geometry and the electromotive field in the plating chamber 12, the deposition of a metal 27 on the semiconductor wafer 24 will be uneven and generally concave. The metal 27 will be thickest where the distance between the consumable primary anode 20 and the semiconductor wafer 24 is the shortest and will be thinner where the consumable primary anode 20 and the semiconductor wafer 24 are further apart.

The variation in thickness of the metal 27 makes it very difficult to properly planarize the semiconductor wafer 24 by subsequent chemical-mechanical planarization processes and results in defective integrated circuits around the perimeter of the semiconductor wafer 24.

Figure 3:
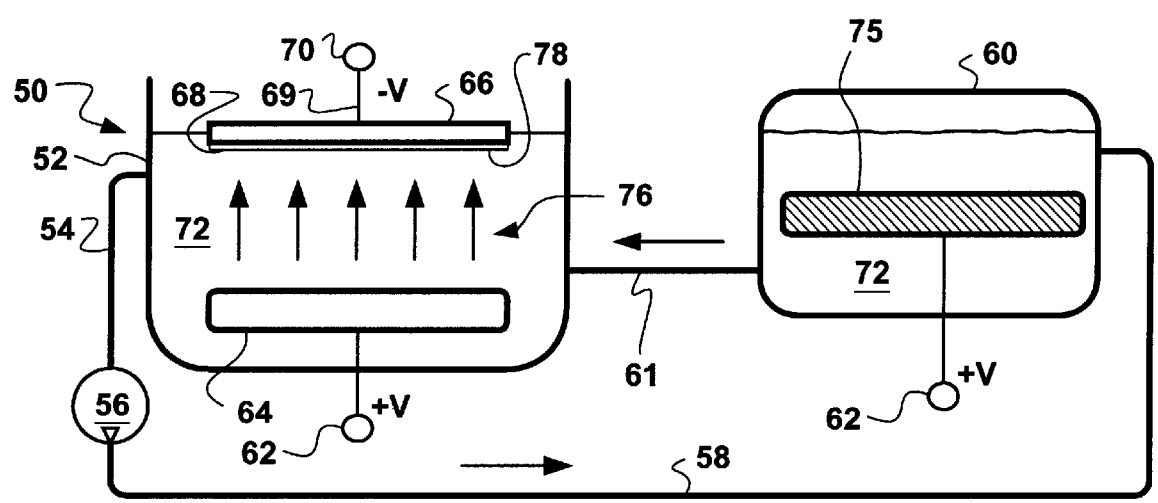
FIG. 3 shows a plating chamber having the remote anode of the present invention.

Referring now to FIG. 3, therein is shown an electroplating system 50 according to the present invention. The electroplating system 50 includes a plating chamber 52 having an outlet 54 connected to a recirculating pump 56 which is further connected by an inlet 58 to a plating solution reservoir 60. The plating solution reservoir 60 is connected by a second inlet 61 to the plating chamber 52.

Within the plating chamber 52 is an inert primary anode 64 connected to a positive voltage source 62. The inert primary anode 64 is of a material, which will not take part in the plating process and which is not consumed, such as platinum (Pt).

Above the inert primary anode 64 is a semiconductor wafer 66 having a conductive seed layer 68 thereon. The seed layer 68 is connected by a connector 69 to a negative voltage source 70 and acts as the cathode for the plating process. The semiconductor wafer 66 is positioned so as to place the seed layer 68 in contact with a plating solution 72.

In the plating solution reservoir 60 is a consumable remote secondary anode 75. The consumable remote secondary anode 75 is connected to the positive voltage source 62 and is in fluid communication with the inert primary anode 64 via the second inlet 61.

The consumable remote secondary anode 75 is placed so that, as it is consumed, the geometry and the electromotive field in the plating chamber 52 do not change so the electromotive field for metal ions plated on the seed layer 68 is always the same and directly between the inert primary anode 64 and the semiconductor wafer 66 as indicated by the straight arrows 76.

With the electromotive field being direct, the plated metal 78 on the seed layer 68 will be of a uniform thickness which will be easily planarized by subsequent chemical-mechanical planarization processes.

In operation, the consumable remote secondary anode 75 introduces metal ions to the plating solution 72 in the plating solution reservoir 60. The plating solution 72 is then recirculated to the plating chamber 52 either by gravity feed (as shown) or pumping (not shown). In the plating chamber 52, the inert primary anode 70 and the seed layer 68 provide the electromotive force to deposit the metal ions onto the seed layer 68.

As the metal ions are deposited and the plating solution 72 becomes diluted, it is recirculated by the pump 56 (as shown) or gravity fed (not shown) back to the plating solution reservoir 60 where the consumable remote secondary anode 75 will replenish the metal ions uniformly.

In the deposition of copper, the seed layer 68 is of copper deposited by a process such as sputtering or chemical vapor deposition, and the inert primary anode 64 is of platinum (Pt), and the consumable remote secondary anode 75 is of metallic copper.

By having the inert primary anode 70 in the plating chamber 52, the geometry and the electromotive field in the plating chamber 52 are not changed during plating because the inert primary anode 70 does not dissolve and because the consumable remote secondary anode 75 is in a separate area independent of the geometry and the electromotive field in the plating chamber 52.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations which fall within the spirit and scope of the appended claims. All matters hither-to-fore set forth herein or shown in the accompanying drawings are to be interpreted in an illustrative and non-limiting sense.

The invention claimed is:

1. A plating system for a semiconductor wafer comprising:
   a plating chamber;
   a plating solution reservoir connected to the plating chamber;
   a circulating system for circulating plating solution between the plating chamber and the plating solution reservoir;
   an inert primary anode in the plating chamber and connectible to a source of positive voltage;
   a semiconductor wafer connector in the plating chamber and connectible to connect the semiconductor wafer to a source of negative voltage; and
   a consumable remote secondary anode in the plating solution reservoir and connectible to the source of positive voltage.

2. The plating system as claimed in claim 1 wherein the circulating system includes a pumping system for pumping plating solution from the plating chamber to the plating solution reservoir.

3. The plating system as claimed in claim 1 wherein the circulating system includes a pumping system for pumping plating solution from the plating solution reservoir to the plating chamber.

4. The plating system as claimed in claim 1, wherein the plating chamber is configured to have plating solution cover the inert primary anode and the consumable remote secondary anode.

5. The plating system as claimed in claim 1 wherein the semiconductor wafer has a seed layer and the plating chamber is configured to have plating solution contact the seed layer.

6. The plating system as claimed in claim 1 including a source of positive voltage and a source of negative voltage.

7. A copper plating system for a semiconductor wafer comprising:
   a copper plating chamber;
   a copper ion plating solution reservoir connected to the plating chamber;
   a circulating system for circulating copper ion plating solution between the copper plating chamber and the copper ion plating solution reservoir;

an inert platinum anode in the copper plating chamber and connectible to a source of positive voltage;

a semiconductor wafer connector in the copper plating chamber and connectible to connect the semiconductor wafer to a source of negative voltage; and a remote consumable copper anode in the copper plating solution reservoir and connectible to the source of positive voltage.

8. The copper plating system as claimed in claim 7 wherein the circulating system includes a pumping system for pumping copper ion plating solution from the copper plating chamber to the copper ion plating solution reservoir.

9. The copper plating system as claimed in claim 7 wherein the circulating system includes a pumping system for pumping copper ion plating solution from the copper ion plating solution reservoir to the copper plating chamber.

10. The copper plating system as claimed in claim 7 wherein the copper plating chamber is configured to have cooper ion plating solution cover the inert platinum anode and the remote consumable copper anode.

11. The copper plating system as claimed in claim 7 wherein the semiconductor wafer has a copper seed layer and the copper plating chamber is configured to have copper ion plating solution contact the copper seed layer.

12. The copper plating system as claimed in claim 7 including a source of positive voltage and a source of negative voltage.

* * * * *